United States Patent
Call et al.

(10) Patent No.: US 10,607,928 B1
(45) Date of Patent: Mar. 31, 2020

(54) REDUCTION OF LAMINATE FAILURE IN INTEGRATED CIRCUIT (IC) DEVICE CARRIER

(71) Applicant: International Business Machines Corporation, Armonk, NY (US)

(72) Inventors: Anson J. Call, Poughkeepsie, NY (US); Sushumna Iruvanti, Wappingers Falls, NY (US); Shidong Li, Hopewell Junction, NY (US); Brian W. Quinlan, Poughkeepsie, NY (US); Kamal K. Sikka, Poughkeepsie, NY (US); Rui Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/529,002

(22) Filed: Aug. 1, 2019

Related U.S. Application Data (63) Continuation of application No. 16/377,681, filed on Apr. 8, 2019, now abandoned.

(51) Int. Cl.
| | |
|---|---|
| *H01L 23/498* | (2006.01) |
| *H01L 23/00* | (2006.01) |
| *H01L 21/48* | (2006.01) |
| *H01L 23/31* | (2006.01) |
| *H01L 23/367* | (2006.01) |
| *H01L 23/433* | (2006.01) |
| *H01L 23/053* | (2006.01) |
| *H01L 23/10* | (2006.01) |

(52) U.S. Cl.
CPC ...... *H01L 23/49822* (2013.01); *H01L 21/486* (2013.01); *H01L 21/4857* (2013.01); *H01L 23/49816* (2013.01); *H01L 23/49827* (2013.01); *H01L 23/49838* (2013.01); *H01L 24/16* (2013.01); *H01L 23/053* (2013.01); *H01L 23/10* (2013.01); *H01L 23/3185* (2013.01); *H01L 23/367* (2013.01); *H01L 23/433* (2013.01); *H01L 2224/16227* (2013.01)

(58) Field of Classification Search
CPC . H01L 23/49827; H01L 21/486; H01L 24/16; H01L 2224/16227
USPC .......................................................... 174/251
See application file for complete search history.

(56) References Cited

U.S. PATENT DOCUMENTS

| | | |
|---|---|---|
| 6,037,662 A | 3/2000 | Yoon et al. |
| 6,410,981 B2 | 6/2002 | Tao |

(Continued)

OTHER PUBLICATIONS

List of IBM Patents or Patent Applications Treated as Related, filed herewith.

*Primary Examiner* — Sherman Ng
(74) *Attorney, Agent, or Firm* — ZIP Group PLLC (57) ABSTRACT

An integrated circuit (IC) device carrier, such as a chip carrier, die carrier, or the like, includes a contact that locally reduces laminate strain within the IC device carrier. One type of contact pad described includes tapered sidewall(s). For example, a positively tapered contact pad includes one or more sidewalls obtusely angled relative to the contact surface of the IC carrier and a negatively tapered contact pad includes one or more sidewalls acutely angled relative to the contact surface of the IC carrier. Another type of contact pad described includes a contact pad connected to one or more pillars. The pillar(s) are also connected to a ring formed within an internal wiring level of the IC device carrier.

20 Claims, 9 Drawing Sheets

(56) References Cited

U.S. PATENT DOCUMENTS

| | | |
|---|---|---|
| 6,507,119 B2 | 1/2003 | Huang et al. |
| 7,737,563 B2 | 6/2010 | Su et al. |
| 8,263,878 B2 | 9/2012 | Takenaka et al. |
| 9,247,644 B2 | 1/2016 | Kaneko et al. |
| 2008/0283982 A1 | 11/2008 | Liu et al. |
| 2012/0049343 A1 | 3/2012 | Schulze et al. |
| 2012/0049350 A1 | 3/2012 | Grillberger et al. |
| 2012/0256320 A1 | 10/2012 | Kaneko |
| 2012/0273938 A1* | 11/2012 | Choi ............... H01L 23/49816 257/737 |
| 2015/0097298 A1 | 4/2015 | Chen et al. |
| 2017/0152888 A1 | 6/2017 | Kawaai |

\* cited by examiner

REDUCTION OF LAMINATE FAILURE IN INTEGRATED CIRCUIT (IC) DEVICE CARRIER

FIELD OF THE EMBODIMENTS

Embodiments of the present invention generally relate to integrated circuit (IC) device carriers, such as an IC chip carrier, IC die carrier, or the like that include contact pad structures, with features to limit or reduce the risk of cracking, delamination, or the like of one or more laminate layers therein.

DESCRIPTION OF THE RELATED ART

The ever increasing need to handle large amounts of data in shorter periods of time challenges high performance signal transmission between IC devices, such as a processor chip, memory die, or the like and external devices such as a motherboard, system board, or the like. The accuracy with which circuits perform, or the ability of the circuits to accurately process high speed signals, depends on minimizing possible signal losses. Such efforts have resulted in the electronic packaging industry to utilize insulator materials that significantly reduce dielectric loss at higher signal speeds and to utilize structures that assure high frequency signal transmissions. Unfortunately, such solutions may result in the cracking, delamination, fatigue, short life spans, and the like, of carrier laminates caused by laminate strain due to fluctuating thermal and mechanical loading.

A known solution to reduce laminate strain is to utilize less flexible materials to reduce the amplitude of the strain seen by the laminate. Either a stiffer core or thicker dielectric ply is typically utilized and will classically lead to a substantial increase in the overall carrier thickness.

Another known solution to reduce laminate strain is to utilize more durable materials that will adequately tolerate the anticipated thermal and mechanical loading. However, there is often a compromise between the beneficial fatigue strength of such durable materials and their typically undesirable electrical properties. In other words, materials that meet both the electrical requirements and thermomechanical requirements are not readably available.

SUMMARY

In an embodiment of the present invention, an integrated circuit (IC) device carrier is presented. The carrier includes a an outer laminate layer upon an internal laminate layer. The carrier also includes a contact. The contact includes a contact pad upon the outer laminate layer, an inner carrier ring upon the internal laminate layer, and a pillar connected to the contact pad and to the inner carrier ring.

In another embodiment of the present invention, an IC device carrier fabrication method is presented. The method includes forming an inter carrier ring upon an internal layer of the carrier, forming one or more layers upon the internal layer and upon the inter carrier ring, forming a pillar upon the inter carrier ring within the one or more layers, and forming a contact pad upon the one or more layers and upon the pillar.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 9 through FIG. 20 depict cross section views of IC device carrier fabrication stages, according to one or more embodiments of the present invention.

DETAILED DESCRIPTION

An integrated circuit (IC) device carrier, such as a chip carrier, die carrier, or the like includes a contact pad structure that locally reduces laminate strain with the IC device carrier. One type of contact pad described herein includes tapered sidewall(s). For example, a positively tapered contact pad includes one or more sidewalls obtusely angled relative to the contact surface of the IC carrier and a negatively tapered contact pad includes one or more sidewalls acutely angled relative to the contact surface of the IC carrier. Another type of contact pad described herein includes a contact pad connected to one or more pillars. The pillars are also connected to a ring formed within an internal wiring level of the IC device carrier.

Figure 1:
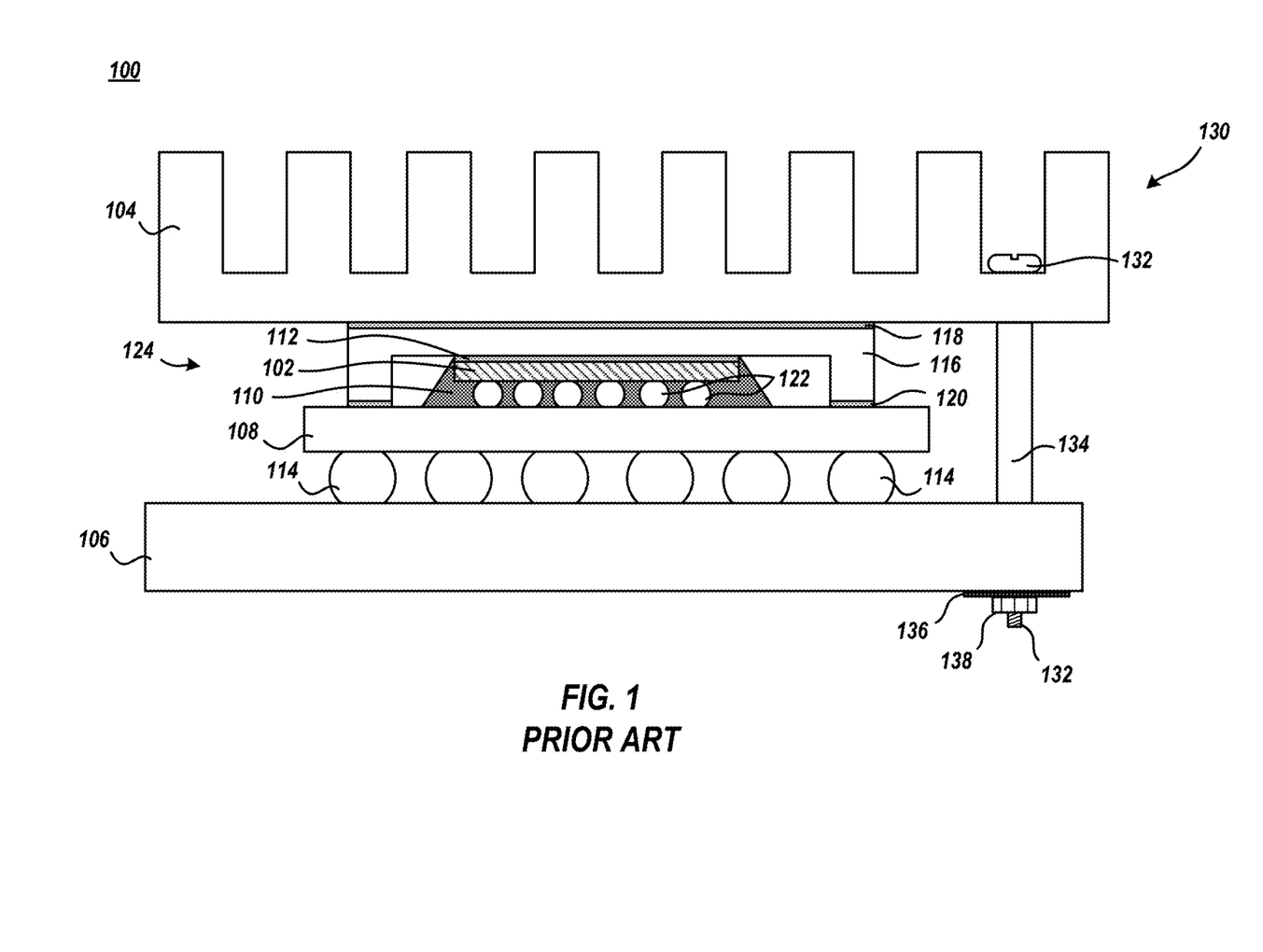
FIG. 1 depicts a prior art electronic system.

FIG. 1 depicts a prior art electronic device 100. Electronic device 100 may be for example a computer, server, mobile device, tablet, and the like. Package 124 includes chip 102, carrier 108, interconnects 122, underfill 110, thermal interface material 112, lid 116, and adhesive 120. Chip 102 may be an IC chip, die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is joined to carrier 108 and the interconnect solder balls 122 are encapsulated with an underfill 110, a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Package 124 may be connected to a motherboard 106 by interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect by an intervening socket may be established.

To assist in the removal of heat from chip 102 a heat sink 104 may be thermally joined to package 124 by thermal interface material 118. Heat sink 104 is a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, and the like. Heat sink 104 may be connected to motherboard 106 by one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon package 124.

Figure 2A:
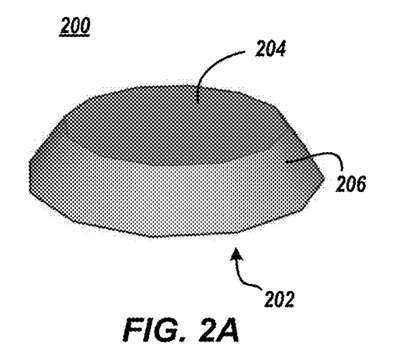
FIG. 2A and FIG. 2B depict a tapered contact pad that may be utilized by one or more embodiments of the present invention.
Figure 2B:
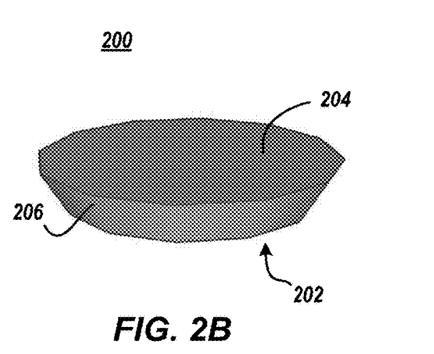

FIG. 2A and FIG. 2B depict a tapered contact pad 200 that may be utilized by one or more embodiments of the present invention. Tapered contact pad 200 includes a solder facing surface 204 and a carrier facing surface 202. Solder facing surface 204 and carrier facing surface 202 are connected by one or more tapered sidewalls 206. For example, when solder facing surface 204 and carrier facing surface 202 are both circular, as is depicted, a single tapered sidewall 206 connects solder facing surface 204 with carrier facing surface 202. Similarly, when solder facing surface 204 and carrier facing surface 202 are both square, four instances of a tapered sidewall 206 connect a side of solder facing surface 204 with an associated side of carrier facing surface 202. Contact pad 200 is formed of an electrically conductive material. For example, contact pad 200 may be formed from a metal, such as Copper, or the like.

FIG. 2A depicts an exemplary embodiment where tapered sidewall 206 is positively tapered such that tapered sidewall 206 is obtusely angled (i.e. greater than 90 degrees) relative to the surface of the carrier that which carrier facing surface 202 is in contact. FIG. 2B depicts an exemplary embodiment where tapered sidewall 206 is negatively tapered such that tapered sidewall 206 is acutely angled (i.e. less than 90 degrees) relative to the surface of the carrier that which carrier facing surface 202 is in contact.

Figure 3:
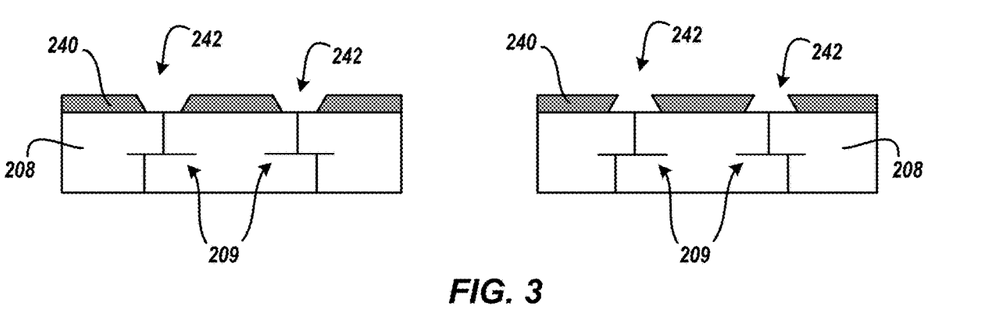
FIG. 3 through FIG. 7 depict cross section views of IC device carrier fabrication stages, according to one or more embodiments of the present invention.

Referring to FIG. 3 which depicts cross section views of a fabrication stage of an IC device carrier 208 that is fabricated to include positively tapered contact pads 200 and an IC device carrier 208 that is fabricated to include negatively tapered contact pads 200. In the present fabrication stage, a mask 240 is formed upon the carrier 208 and is patterned to form contact trenches 242 there within.

Mask 240 may be a known mask material such as a photoresist that may be formed upon the carrier 208 and patterned to form contact trenches 242. Mask 240 may be applied as a liquid that may subsequently dry and is patterned generally forming trenches 242 within the mask 240 that expose underlying portions of the carrier and may further expose a wiring line 209 within the carrier 208. For example, when mask 240 is a photoresist, a liquid photoresist may be formed by precision spraying, roller coating, dip coating, spin coating, etc. Exemplary liquid photoresists can be either positive tone resists such as TCIR-ZR8800 PB manufactured by Tokyo Ohka Kogyo America, Inc. or negative tone resists such as JSR THB 126N manufactured by JSR Micro, Inc., Poly(methyl methacrylate) (PMMA), Poly(methyl glutarimide) (PMGI), Phenol formaldehyde resin (DNQ/Novolac), etc. Mask 240 may also be a semi-solid film coated, laminated, or otherwise formed upon carrier 208. For example, mask 240 may be a dry photoresist such as Asahi CX8040, Asahi CXA240, Riston photoresists, WBR photoresists.

Mask 240 is of sufficient thickness to form contact 200. As such, mask 240 may be chosen to be of a material and a thickness to satisfy such requirements. For example, mask 240 may have a thickness ranging from about 5 um to about 500 um, although a thickness less than 5 um and greater than 500 um have been contemplated. In one embodiment, mask 240 may be about 5 um to 20 um thick.

A pattern may be formed in the mask 240 by removing portions of the mask 240. For example, when mask 240 is a photoresist, portions of the mask 240 may be exposed to radiation such as deep ultraviolet light or electron beams. Protected portions of the mask 240 that may not have been subjected to such exposure may be retained and the exposed portions of mask 240 may be etched away by an etchant that removes mask 240 material. The portions of mask 240 that are etched away reveal the underlying portions of the carrier 208 and or reveal the wiring lines 209 there within, respectively. In various embodiments, the portions of mask 240 that are etched away form trenches 242 in which electrically conductive materials may be fabricated within.

Known etching techniques may be utilized to form trenches 242 that have tapered sidewalls. For example, mask 240 may be exposed to a graded amount of radiation from the outside of the intended position of trench 242 to the center of the intended position of trench 242 (e.g. an increasing amount of exposure, a decreasing amount of exposure, etc.) and from the center of the intended position of trench 242 to the opposing outside of the intended position of trench 242 to (e.g. a decreasing amount of exposure, an increasing amount of exposure, etc.) to form a negatively tapered trench 242, as is shown on the left side of FIG. 3 and/or to form a positively tapered trench 242, as is shown on the right side of FIG. 3.

Figure 4:
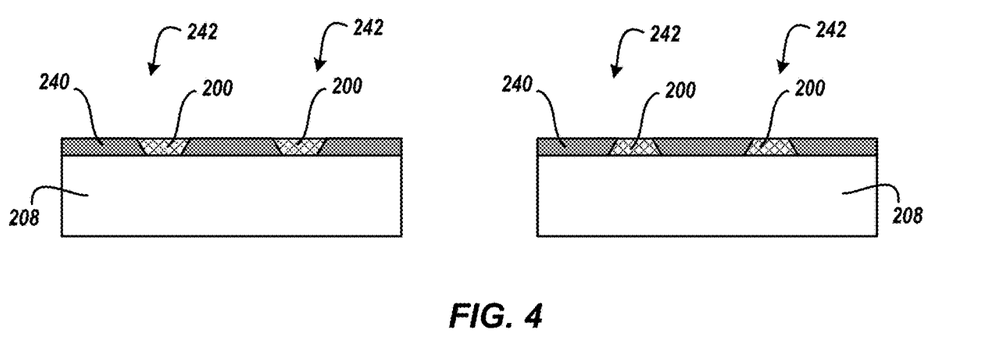

Referring to FIG. 4 which depicts cross section views of a fabrication stage of an IC device carrier 208 that is fabricated to include positively tapered contact pads 200 and an IC device carrier 208 that is fabricated to include negatively tapered contact pads 200. In the present fabrication stage, conductive material is fabricated within the contact trenches 242 to form tapered contact pads 200.

Conductive material may be formed within the contact trenches 242 by known formation, deposition, fabrication techniques. For example, conductive material, such as Copper, or the like, may be formed within the contact trenches 242 by plating. Plating, electroplating, electrodeposition, etc. is a process in which carrier 208 is placed in a plating tool reservoir which contains a plating solution (e.g. plating bath, etc.). The carrier 208 may be attached to a fixture such that only carrier 208 portions exposed by trenches 242 are exposed to the plating solution. An electrical circuit is created when a negative terminal of a power supply contacts electrically conductive seed layer portions that may be formed upon the carrier 208 within trenches 242 so as to form a cathode and a positive terminal of the power supply is connected to plating material in the tool revisor so as to form an anode.

The plating material may be a stabilized metal specie in the plating solution. During the plating process, when an electrical current is passed through the circuit, this metal specie is dissolved in the solution which take-up electrons forming contact 200 consuming the seed upon the exposed carrier 208 within trenches 242. In a particular embodiment, the plating material may be, for example, Copper (Cu). In an exemplary Cu plating process, in a sulfate solution, Copper is oxidized at the anode to $Cu^{2}+$ by losing two electrons. The $Cu^{2}+$ associates with $SO_4^{2-}$ in the solution to form copper sulfate. At the cathode, the $Cu^{2}+$ is reduced to metallic Cu by gaining two electrons, thereby forming a Copper contact 200 within trenches 242.

Figure 5:
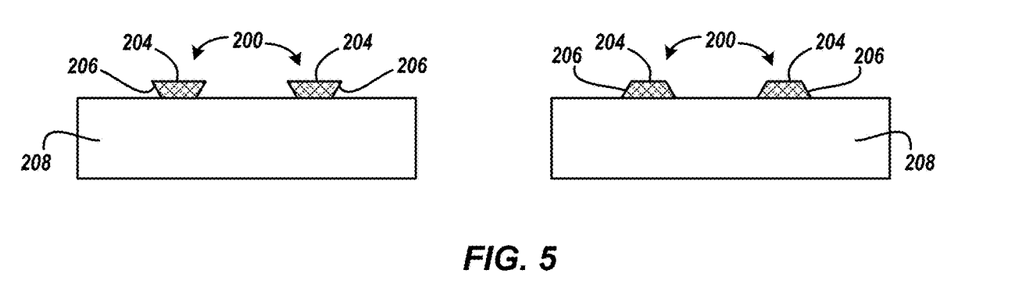

Referring to FIG. 5 which depicts cross section views of a fabrication stage of an IC device carrier 208 that is fabricated to include positively tapered contact pads 200 and an IC device carrier 208 that is fabricated to include negatively tapered contact pads 200. In the present fabrication stage, mask 240 is removed from carrier 208. Mask 240 may be removed from carrier 208 by known removal techniques. For example, mask 240 may be removed by etching, or the like. Upon mask 240 being removed from carrier 208, contacts 200 are retained thereon such that carrier 208 includes positively tapered contact pads 200, as shown on the right side of FIG. 5, and/or such that carrier 208 includes negatively tapered contact pads 200, as shown on the left side of FIG. 5.

Figure 6:
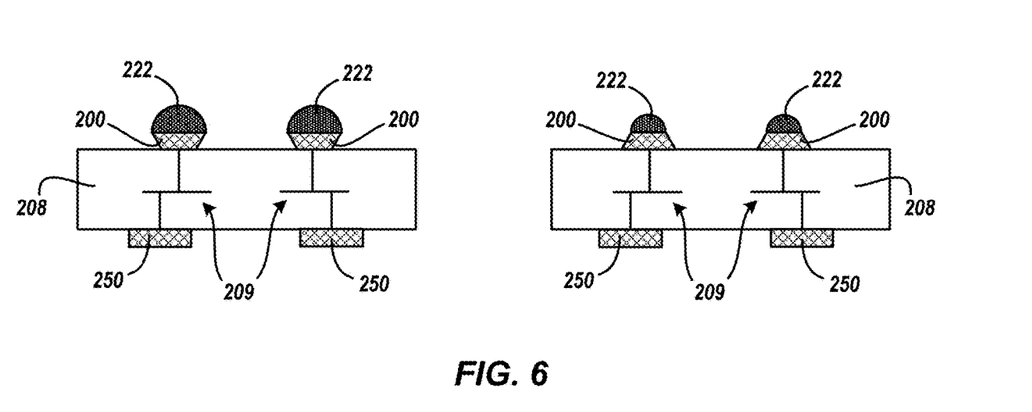

Referring to FIG. 6 which depicts cross section views of a fabrication stage of an IC device carrier 208 that is fabricated to include positively tapered contact pads 200 and an IC device carrier 208 that is fabricated to include negatively tapered contact pads 200. In the present fabrication stage, solder interconnect 222 may be formed upon contact 200. In the present fabrication stage, contacts 200 and/or contacts 250 may be formed upon an opposing side of carrier 208 relative to those contacts 200 formed e.g. as depicted in FIG. 3 through FIG. 5.

In some embodiments, solder interconnect 222 may be formed upon contact 200. For example, a solder ball may be applied to the solder facing surface 204 of each contact 200, solder may be formed upon the solder facing surface 204 of each contact 200, or the like. Solder interconnect 222 may be applied or formed upon the solder facing surface 204 generally by known practices.

In some embodiments, contacts 200 and/or contacts 250 may be formed upon the opposing side of carrier 208 relative to those contacts 200 already formed. For example, the techniques depicted in FIG. 3 through FIG. 5 may be performed upon the opposing side of carrier 208. Contacts 250 may be formed upon the carrier 208 and upon e.g. wiring line 209 by forming a contact trench within a mask with sidewalls that are orthogonal (i.e. 90 degrees) to the contact surface of the carrier 208.

A positively tapered contact 220 reduces the strain upon the laminate layer(s) within carrier 208 locally around the contact 220, e.g. a 3% strain reduction, relative to e.g., a contact 250 with orthogonal sidewalls to the carrier. A negatively tapered contact 220 reduces the strain upon the laminate layer(s) within carrier 208 locally around the contact 220, e.g. a 12% reduction, relative to e.g., a contact 250 with orthogonal sidewalls to the carrier. Such reduction of laminate strain may be a result of the tapered sidewall(s) 206 reducing abrupt stiffness discontinuity. Such reduction of laminate strain, especially with the negative taper contact, is significant and reduces laminate cracking, delamination, fatigue, short life span, etc. caused by fluctuating or cyclic thermal and mechanical loading without the drawbacks of a thicker or stiffer carrier or the carrier utilizing materials that do not have desirable electrical characteristics.

Figure 7:
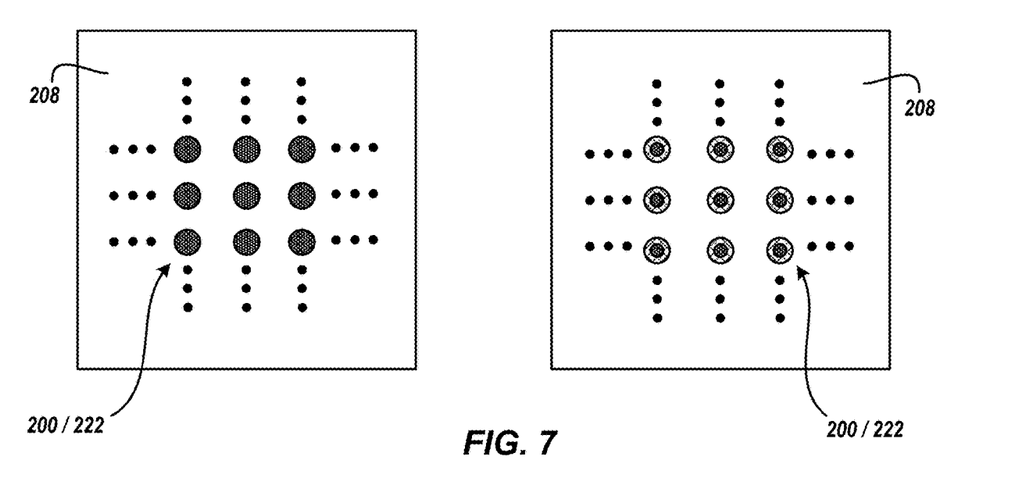

Referring to FIG. 7 which depicts normal views of IC device carrier 208 that is fabricated to include positively tapered contact pads 200 and of IC device carrier 208 that is fabricated to include negatively tapered contact pads 200. In some embodiments, the carrier 208 includes a grid of solder tapered contact pads 200 arranged in rows and columns. Therefore, in those embodiments where solder interconnect 222 is formed or applied to each contact 200, a grid of solder interconnects 222 that are associatively arranged in rows and columns may also be formed.

Figure 8:
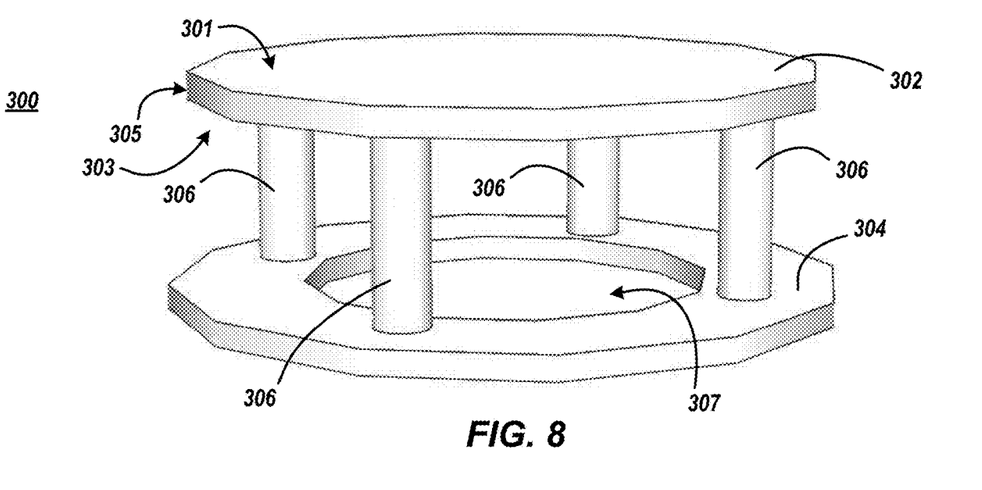
FIG. 8 depicts a contact that may be utilized by one or more embodiments of the present invention.

Referring to FIG. 8 which depicts an exemplary contact 300 that may be utilized by one or more embodiments of the present invention. Contact 300 includes a contact pad 302, one or more pillars 306, and an inter carrier ring 304.

Contact pad 302 includes a solder facing surface 301 and a carrier facing surface 303. Solder facing surface 301 and carrier facing surface 303 are connected by one or more sidewalls 305. Sidewalls 305 may be orthogonal to the carrier, like contact 250. Alternatively, sidewalls 305 may be tapered to the carrier, like contact 200. Contact pad 302 is formed of an electrically conductive material. For example, contact pad 302 may be formed from a metal, such as Copper, or the like.

Inter carrier ring 304 is formed within a wiring level of the carrier. In other words, inter carrier ring 304 is internal to the carrier. Inter carrier ring 304 may be formed simultaneously with other wiring lines within the same wiring level of the carrier and therefore may be formed of the same material as the wiring line of the carrier 304. Inter carrier ring 304 may have a thickness equal to the wiring line in which it is formed. Inter carrier ring 304 includes a clearance opening 307 such that wiring feature(s) may extend therethrough and contact pad 302. The contact pad 302, the inter carrier ring 304, and the clearance opening may be concentric about the same axis. Inter carrier ring 304 is formed of an electrically conductive material. For example, inter carrier ring 304 may be formed from a metal, such as Copper, or the like. Inter carrier ring 304 may be formed from the same material as the wiring lines in the wiring level in which it is formed.

Pillar 306 is a pillar that connects the contact pad 302 and the inter carrier ring 304. In some embodiments, pillar 306 is a vertical interconnect access (VIA), or the like. Pillar 306 is formed of an electrically conductive material. For example, pillar 306 may be formed from a metal, such as Copper, or the like.

Figure 9:
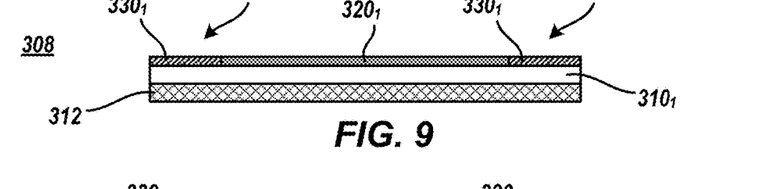

Referring to FIG. 9 which depicts a cross section view of a fabrication stage of an IC device carrier 308 that is fabricated to include a contact 300. In the present fabrication stage, a first laminate layer 310$_1$ is formed upon an internal layer 312 and one or more wiring lines 330$_1$ in a first wiring level upon the laminate layer 310$_1$ are formed. For clarity, throughout this specification, a specific subscripted numeral, such as laminate layer 3101 is a specific instance of a non-subscripted numeral, such as laminate layer 310. In other words, the non-subscripted numeral applies generically to all the subscripted numerals.

The IC device carrier 308 may be an organic carrier composed of layers of build-up that contain e.g., wiring layers, planes, or the like and/or an internal layer 312, such as a core layer, a temporary core layer, prepreg layer(s), or the like, that provides mechanical strength. Internal layer 312 is an internal layer to the carrier 308 and may be any known core layer, temporary core layer, prepreg layer(s), or the like, as is known in the IC device carrier art. For example, internal layer 312 may be a single layer or multilayer glass-fiber-reinforced dielectric layer cladded by a conductive layer (not shown) on each side. For clarity, the build-up layers are depicted on one side of the internal layer 312 from FIG. 9 through FIG. 21A and the opposing side of internal layer 312 may be subjected to wiring line fabrication stages, as is known in the art. The carrier 308 may be fabricated by depositing alternate layers of conducting metal and laminate layer(s). Each conductive layer may be patterned into conducting metal lines using e.g., photoresist and photolithographic techniques. After the metal wiring lines are deposited, the photoresist may be removed and a second photoresist may be deposited and patterned to define one or more conductive posts which function as through holes between metal layers.

Wiring lines 330 may be formed upon the laminate layer 310 by known techniques. For example, a metal layer may be provided upon the laminate layer 310 and portions of the metal layer that are undesired may be removed by, e.g., protecting the portions of the metal layer to be retained with a mask and etching away the undesired portions of the metal layer that are not protected by the mask. Alternatively, wiring lines 330 may be directly added to the laminate layer 310 by forming a mask 320 upon the laminate layer 310. The mask 320 may be patterned by removing portions of the mask 320 where the wiring lines are desired forming a wiring line trench 322. Electrically conductive material, such as a metal, or the like may then be formed within the wiring line trench 322, thus forming the wiring line 330. Subsequently, the mask 320 may be removed. The carrier 308 may be built up by inactively adding a next laminate layer 310 to the structure that was previously fabricated and forming wiring lines 330 thereupon as is depicted, e.g., in FIG. 9 through FIG. 21A. Generally, wiring line 330 is an electrically conductive pathway internal to the carrier and is connected to a contact on the first side of the carrier and is connected to a contact on the opposing side of the carrier and is utilized as a conduit for electrical current (i.e. electrical signals, potential, or the like) that is generally a part of the data handling processes of the IC device.

Figure 10:
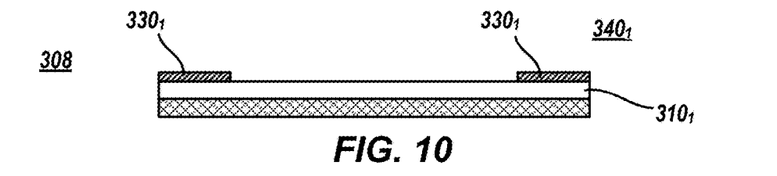

In the exemplary embodiment depicted in FIG. 9, a first laminate layer 310$_1$ is formed upon internal layer 312 and one or more wiring lines 330$_1$ in a first wiring level are formed upon laminate layer 310$_1$. Wiring lines 330$_1$ may be directly added to the laminate layer 310$_1$ by forming a mask 320$_1$ upon the laminate layer 310$_1$. The mask 320$_1$ may be patterned by removing portions of the mask 320$_1$ and exposing the underlying portion of laminate layer 310$_1$ where the wiring lines are desired, thereby forming a wiring line trench 322$_1$. Electrically conductive material, such as a metal, or the like may then be formed within the wiring line trench 322$_1$, thus forming the wiring line 330$_1$. Subsequently, as is depicted in FIG. 10, the mask 320$_1$ may be removed, thereby forming a structure 340$_1$.

Figure 11A:
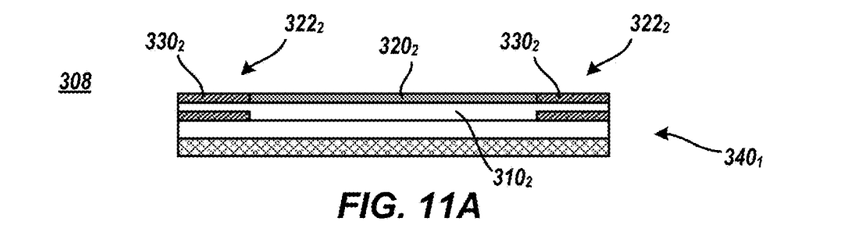

Referring to FIG. 11A which depicts a cross section view of a fabrication stage of an IC device carrier 308 that is fabricated to include a contact 300. In the present fabrication stage, a second laminate layer 310$_2$ and one or more wiring lines 330$_2$ in a second wiring level are formed.

Figure 11B:
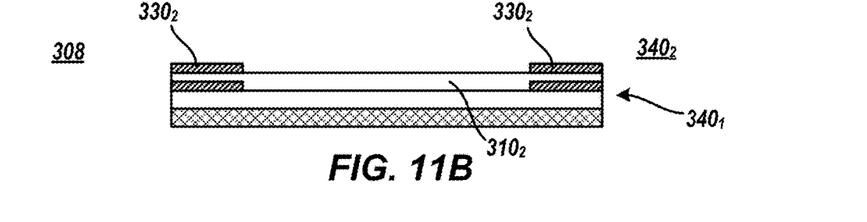

The second laminate layer 310$_2$ is formed, adhered, laminated, or the like, upon and to structure 340$_1$. Wiring lines 330$_2$ may be directly added to the laminate layer 310$_2$ by forming a mask 320$_2$ upon the laminate layer 310$_2$. The mask 320$_2$ may be patterned by removing portions of the mask 320$_2$ and exposing the underlying portion of laminate layer 310$_2$ where the wiring lines are desired, thereby forming a wiring line trench 322$_2$. Electrically conductive material, such as a metal, or the like may then be formed within the wiring line trench 322$_2$, thus forming the wiring line 330$_2$. Subsequently, as is depicted in FIG. 11B, the mask 320$_2$ may be removed, thereby forming a structure 340$_2$.

Figure 12:
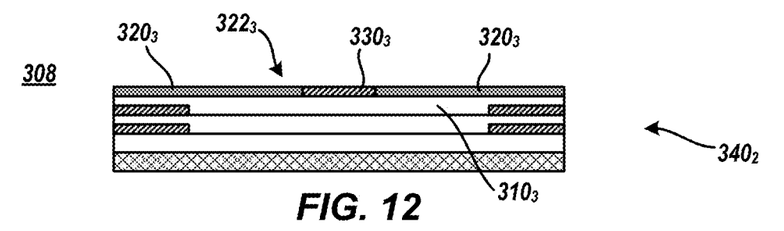

Referring to FIG. 12 which depicts a cross section view of a fabrication stage of an IC device carrier 308 that is fabricated to include a contact 300. In the present fabrication stage, a third laminate layer 310$_3$ and one or more wiring lines 330$_3$ in a third wiring level are formed.

Figure 13:
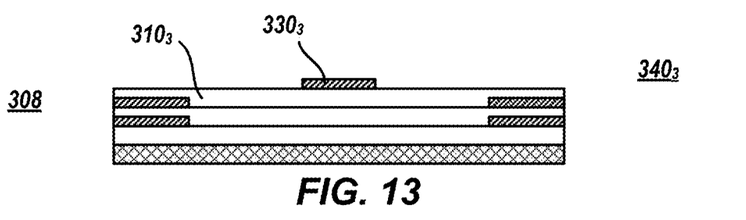

The third laminate layer 310$_3$ is formed, adhered, laminated, or the like, upon and to structure 340$_2$. Wiring line(s) 330$_3$ may be directly added to the laminate layer 310$_3$ by forming a mask 320$_3$ upon the laminate layer 310$_3$. The mask 320$_3$ may be patterned by removing portions of the mask 320$_3$ and exposing the underlying portion of laminate layer 310$_3$ where the wiring lines are desired, thereby forming a wiring line trench 322$_3$. Electrically conductive material, such as a metal, or the like may then be formed within the wiring line trench 322$_3$, thus forming the wiring line 330$_3$. Subsequently, as is depicted in FIG. 13, the mask 320$_3$ may be removed, thereby forming a structure 340$_3$.

Figure 14:
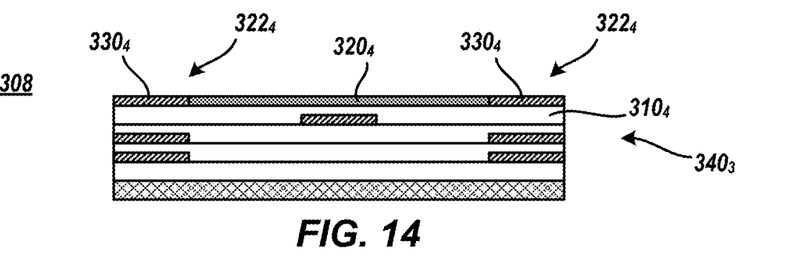

Referring to FIG. 14 which depicts a cross section view of a fabrication stage of an IC device carrier 308 that is fabricated to include a contact 300. In the present fabrication stage, a fourth laminate layer 310$_4$ and one or more wiring lines 330$_4$ in a fourth wiring level are formed.

Figure 15:
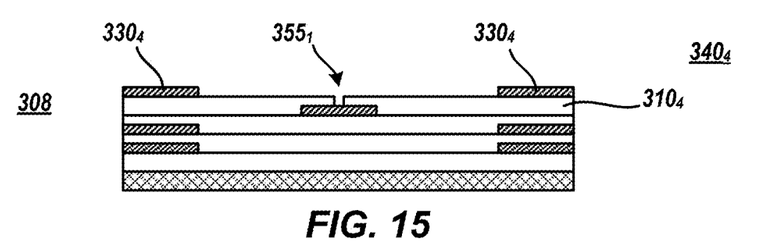

The fourth laminate layer 310$_4$ is formed, adhered, laminated, or the like, upon and to structure 340$_3$. Wiring line(s) 330$_4$ may be directly added to the laminate layer 310$_4$ by forming a mask 320$_4$ upon the laminate layer 310$_4$. The mask 320$_4$ may be patterned by removing portions of the mask 320$_4$ and exposing the underlying portion of laminate layer 310$_4$ where the wiring lines are desired, thereby forming a wiring line trench 322$_4$. Electrically conductive material, such as a metal, or the like may then be formed within the wiring line trench 322$_4$, thus forming the wiring line 330$_4$. Subsequently, as is depicted in FIG. 15, the mask 320$_4$ may be removed and a via trench portion may be formed within laminate layer 310$_4$ that exposes a portion of wiring line 330$_3$, thereby forming a structure 340$_4$. For example, the via trench portion 335$_1$ may be formed by drilling (e.g. laser drilling, etc.) a location of laminate layer 310$_4$ to expose a portion of wiring line 330$_3$.

Figure 16:
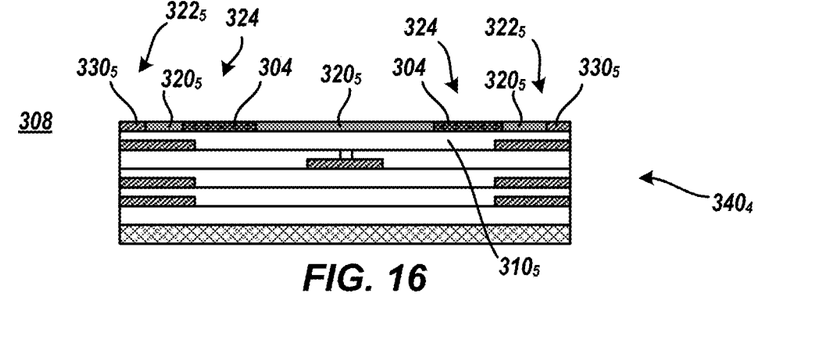

Referring to FIG. 16 which depicts a cross section view of a fabrication stage of an IC device carrier 308 that is fabricated to include a contact 300. In the present fabrication stage, a fifth laminate layer $310_5$, one or more wiring lines $330_5$ in a fourth wiring level, and inter carrier ring 304 are formed.

Figure 17:
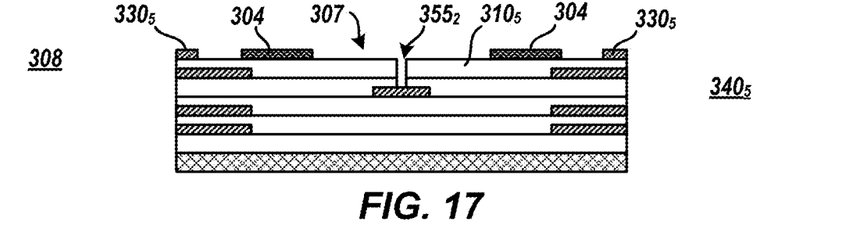

The fifth laminate layer $310_5$ is formed, adhered, laminated, or the like, upon and to structure $340_4$. Wiring line(s) $330_5$ and inter carrier ring 304 may be directly added to the laminate layer $310_5$ by forming a mask $320_5$ upon the laminate layer $310_5$. The mask $320_5$ may be patterned by removing portions of the mask $320_5$ and exposing the underlying portion of laminate layer $310_5$ where the wiring lines and inter carrier ring(s) are desired, thereby forming a wiring line trench $322_5$ and inter carrier ring trench 324, respectively. Electrically conductive material, such as a metal, or the like may then be formed within the wiring line trench $322_5$ and within inter carrier ring trench 324, thus forming the wiring line $330_5$ and inter carrier ring 304. Subsequently, as is depicted in FIG. 17, the mask $320_5$ may be removed and a via trench portion may be formed within laminate layer $310_5$ that exposes the pre-exposed portion of wiring line $330_3$, thereby forming a structure $340_5$. For example, the via trench portion $335_2$ may be formed by drilling (e.g. laser drilling, etc.) a location of laminate layer $310_5$ aligned with via trench portion $335_1$ to expose the previously exposed portion of wiring line $330_3$.

Inter carrier ring 304 may be formed simultaneously with the wiring line(s) 330 within any internal wiring level of the carrier 308. In other words, though inter carrier ring 304 is depicted as fabricated in the fifth wiring level, inter carrier ring 304 may be formed in any of the internal wiring levels of carrier 308. Inter carrier ring 304 may be formed of the same material as the wiring line 330 of the carrier 304. Inter carrier ring 304 may have a thickness equal to the wiring line 330 in the wiring level in which inter carrier ring 304 is formed.

In an embodiment, an outer side surface of inter carrier ring 304 is located beyond the vertical plane of one or more or all the wiring lines 330 there below. For example, an outer side surface of inter carrier ring 304 cross section on the left side of FIG. 17 is beyond or outside of the vertical plane of all the inner side surfaces of the wiring lines 330 and an outer side surface of inter carrier ring 304 cross section on the right side of FIG. 17 is beyond or outside of the vertical plane of all the inner side surfaces of the wiring lines 330. Such overlapping of metal structures may form a structure that blocks cracks or delamination of the laminate layers from propagating.

Figure 18:
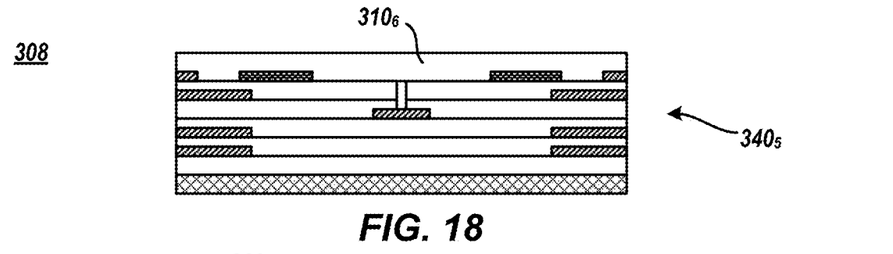

Referring to FIG. 18 which depicts a cross section view of a fabrication stage of an IC device carrier 308 that is fabricated to include a contact 300. In the present fabrication stage, a sixth laminate layer $310_6$ is formed. The sixth laminate layer $310_6$ is formed, adhered, laminated, or the like, upon and to structure $340_5$. In the depicted exemplary embodiment, the first laminate layer $310_1$ and the sixth laminate layer $310_6$ are outer or perimeter layers of the carrier 308. Therefore, the first through fifth wiring levels are internal to the carrier 308 and are between the outer surfaces of the first laminate layer $310_1$ and the sixth laminate layer $310_6$, respectively.

Figure 19:
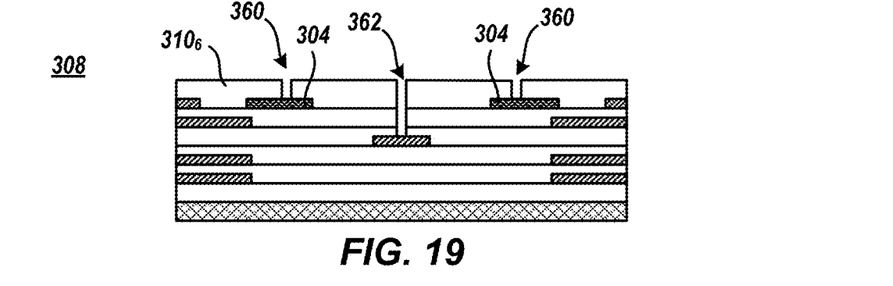

Referring to FIG. 19 which depicts a cross section view of a fabrication stage of an IC device carrier 308 that is fabricated to include a contact 300. In the present fabrication stage one or more pillar trenches 360 and/or one or more wiring line via trenches 362 are formed.

Pillar trench 360 may be formed by removing a section of one or more laminate layer(s) 310 to expose a portion of the inter carrier ring 304. For example, locations of laminate layer(s) $310_6$ may be drilled, or the like, to remove laminate layer $310_6$ material, thereby forming the pillar trench 360 that exposes the portion of the inter carrier ring 304.

Wiring line via trench 362 may be formed by removing a section of one or more laminate layer(s) 310 to expose a portion of an internal wiring line 330. For example, a location(s) of laminate layer(s) $310_6$ may be drilled, or the like, to remove laminate layer(s) $310_6$ material in line with previously formed trench portions $355_1$, $355_2$, thereby forming the wiring line via trench 362 that exposes the portion of the internal wiring line $330_3$.

Figure 20:
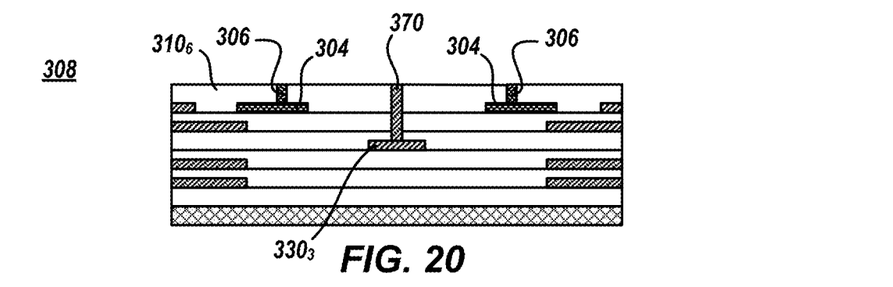

Referring to FIG. 20 which depicts a cross section view of a fabrication stage of an IC device carrier 308 that is fabricated to include a contact 300. In the present fabrication stage one or more pillar 306 and/or one or more wiring line VIAs 370 are formed. Electrically conductive material, such as a metal, or the like may be formed within the pillar trenches 360 and/or one or more wiring line VIA trenches 362, thus forming one or more pillars 306 and/or one or more wiring line VIAs 370. As the pillar trenches 360 are exposed to a portion of inter carrier ring 304, pillar 306 contacts or is otherwise electrically and/or mechanically connected to inter carrier ring 304. As the wiring line VIA trench 362 are exposed to a portion of a wiring line 330, VIA 370 contacts or is otherwise electrically and/or mechanically connected the wiring line 330. Pillar 306 and/or one or more wiring line VIAs 370 may be formed by known deposition techniques, such as plating, or the like. In embodiments, the perimeter surface of laminate $310_6$ may be coplanar with an exposed surface of each pillar 306 there within and may be coplanar with an exposed surface of VIA 370 there within. Clearance opening 307 of inter-carrier ring 304 allows for VIA 370 to extend therethrough from the perimeter surface of laminate $310_6$ to the wring line 330 to which the VIA 370 is connected.

Figure 21A:
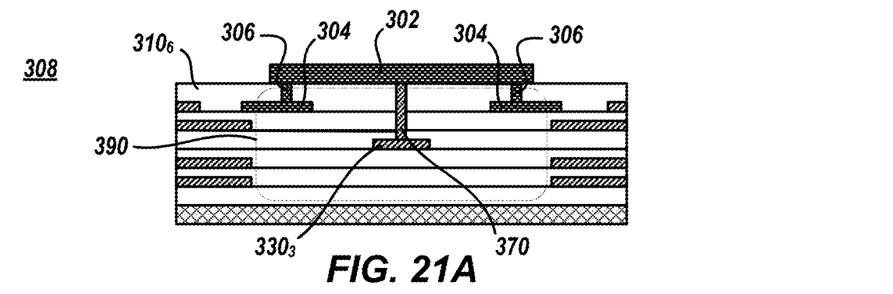
FIG. 21A and FIG. 21B depict views of IC device carrier that includes one or more contacts, according to one or more embodiments of the present invention.

Referring to FIG. 21A which depicts a cross section view of a fabrication stage of an IC device carrier 308 that is fabricated to include a contact 300. In the present fabrication stage one or more contact pads 302 are formed. Contact pads 302 may be formed, e.g., by techniques like those depicted in FIG. 3 through FIG. 6. For example, a mask may be formed upon the perimeter surface of laminate $310_6$. The mask may be patterned creating contact trenches at the location(s) where contact pad(s) 302 are desired and that expose the upper surface of pillars 306 and/or VIA 370. Electrically conductive material, such as a metal, or the like may be formed within the contact trenches, thus forming one or more contact pad(s) 302. The contact pad 302 are formed upon pillars 306 and are thus in electrical contact and/or mechanical contact with each pillar 306. The contact pad 302 may further be formed upon VIA 370 and are thus in electrical contact and/or mechanical contact with VIA 370 and the wiring line in which VIA 370 is further connected. The contact pad 302, the inter carrier ring 304, and the clearance opening 307 may be concentric about the same axis. In an embodiment, the inter carrier ring 304, pillars 306 and contact pad 302 are all formed from the same metal, such as Copper, or the like.

In some embodiments, a silo region 390 is formed within the carrier 308 generally in line with the contact pad 302 (i.e. directly below the pad 302 as depicted) whereby silo region 390 is predominantly laminate layer 310 material. For example, silo region 390 may be a wiring line keep out area, etc. Because silo region 390 is predominantly laminate layer 310 material which lacks metal wiring structures, it is susceptible to laminate cracking, delamination, or the like. To reduce the propensity for such damage, the contact 300 may be utilized in such areas which sandwiches, compresses, or the like, the laminate layers between the contact pad 302 and the inner carrier ring 304.

In some embodiments, the inner carrier ring 304 may extend horizontally from within the silo region 390 and into wiring regions on the perimeter of the silo region 390. For example, the inner carrier ring 304 may extend horizontally from within the region 390 past the sidewalls of one or more of the nearest wiring lines outside of the region 390. Such overlapping of metal structures may form a structure that blocks propagation of cracks, delamination, or other such laminate damage.

The contact 300 reduces the strain upon the laminate layer(s) 310 within carrier 308 locally around the structures of contact 300 relative to e.g., a contact 250 with orthogonal sidewalls to the carrier. Such reduction of laminate strain may be a result of the sandwiching or compressive forces of the laminate layer(s) between the carrier side of contact pad 302 and the inter carrier ring 304 caused or provided by the fixed dimension between the contact pad 302 and the inter carrier ring 304. Such reduction of laminate strain reduces laminate cracking, delamination, fatigue, short life span, etc. caused by fluctuating or cyclic thermal and mechanical loading without the drawbacks of a thicker or stiffer carrier or the carrier utilizing materials that do not have desirable electrical characteristics.

For clarity, in some embodiments, wiring line via 370 and wiring line $330_3$ are not present, such as when silo region 390 is a wiring line keep out area.

Though shown in FIG. 21A with a contact on one side of the carrier 308, carrier 308 may undergo further fabrication stages to e.g., to form contacts 200, 250, 300, or the like on the opposing side of carrier 308, to form or place solder interconnects 222 upon the contacts, or the like. Further, though contact pad 302 is shown in FIG. 21A as having orthogonal sidewalls, contact pad 302 may be fabricated with tapered sidewalls like those of contact 200 with the fabrication stages described herein.

Though inter carrier ring 304 is depicted as being formed in a particular (e.g., fifth) wiring level, it may be formed within the first, second, third, etc. wiring levels more interior to the carrier 308. The associated pillars of this carrier ring 304 may be formed by forming trench portions within the associated laminate layers like the trench portions 355 associated with via trench 362.

Figure 21B:
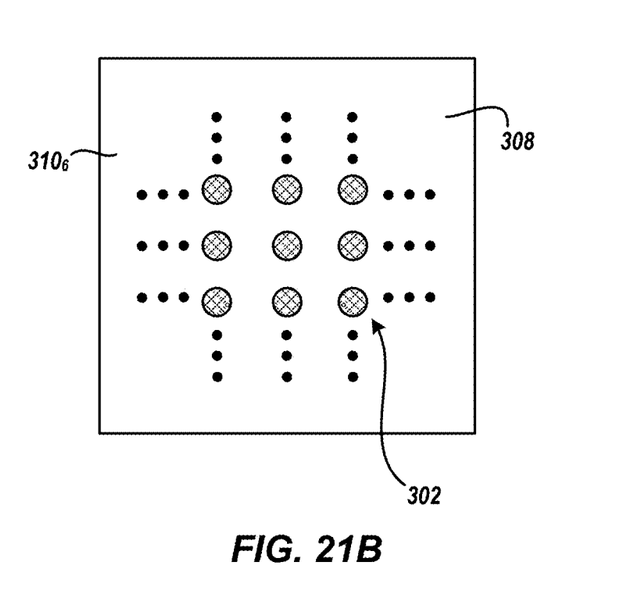

Referring to FIG. 21B which depicts normal views of IC device carrier 308 that is fabricated to include a contact 300. In some embodiments, the carrier 308 includes a grid of contact 300 arranged in rows and columns. In those embodiments where solder interconnect 222 is formed or applied to each contact pad 302, a grid of solder interconnects 222 that are associatively arranged in rows and columns may also be formed.

Figure 22:
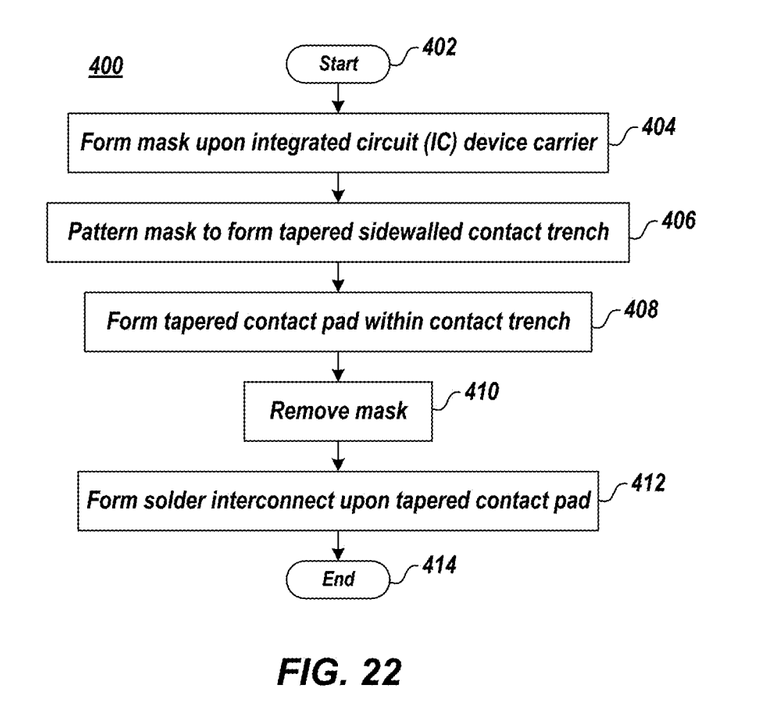
FIG. 22 depicts a method of fabricating an IC device carrier that includes a tapered contact, according to one or more embodiments of the present invention.

FIG. 22 depicts a method 400 of fabricating an IC device carrier that includes a tapered contact pad, according to one or more embodiments of the present invention. Method 400 may be utilized to fabricate a carrier 208, 308 that includes a contact pad that has one or more tapered sidewall(s). Method 400 begins at block 402 and continues with forming a mask upon an IC device carrier perimeter or outer surface (block 404). For example, mask 240 may be formed directly upon the carrier.

Method 400 may continue with patterning the mask to form a tapered side walled contact trench (block 406). For example, tapered side walled contact trench 242 may be formed in the mask 240 thereby exposing a portion of the underlying carrier. Isotropic etching, gradually varying (i.e. graded) exposure of mask 240 to e.g., UV radiation, or the like, may form e.g., positively tapered sidewalls of the contact trench 242 or negatively tapered sidewalls of the contact trench 242.

Method 400 may continue with forming the tapered contact pad upon the carrier within the tapered side walled contact trench (block 408). For example, the tapered contact pad may be formed by plating an electrically conductive metal upon the exposed carrier portion within the tapered contact trench. Subsequently, a chemical mechanical polish may be utilized to removed excess contact material and/or to planarize the solder facing surfaces of each tapered contact.

Method 400 may continue with removing the mask (block 410). For example, mask 240 may be washed, etched, or otherwise removed from the carrier such that the formed tapered contacts remain.

Method 400 may continue with applying or otherwise forming solder interconnect upon the solder facing surface of the tapered contact (block 412). For example, solder 222 may be plated upon the solder facing surface of the tapered contact, solder 222 balls may be applied to the solder facing surface of the tapered contact, or the like. Method 400 may be repeated on the opposing surface of the carrier and may end at block 414.

Figure 23:
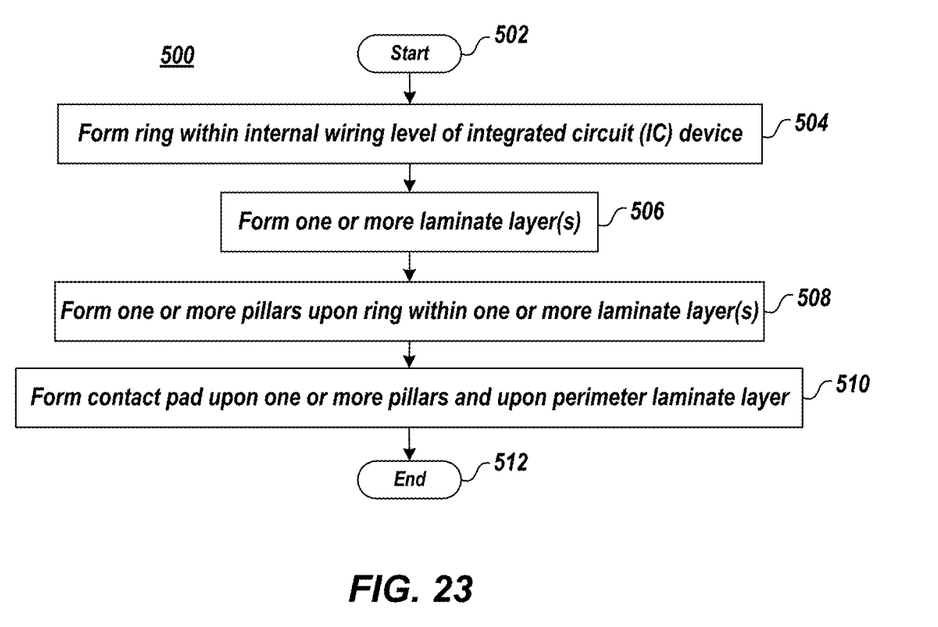
FIG. 23 depicts a method of fabricating an IC device carrier that includes a contact, according to one or more embodiments of the present invention.

FIG. 23 depicts a method 500 of fabricating an IC device carrier that includes a contact 300, according to one or more embodiments of the present invention. Method 500 begins at block 502 and continues with forming an inner-carrier ring within a wiring level of the carrier (block 504). For example, a wiring line 330 and an inter carrier ring 304 may be formed simultaneously within the same wiring level of the carrier. The central axis of the clearance hole 307 of the inter carrier ring 304 may be coincident with the center of the contact 300.

Method 500 may continue with forming one or more laminate layers (block 506). For example, a laminate layer 310 is applied to, formed, adhered to, laminated to, or otherwise formed upon the wiring level on which the inter carrier ring 304 was formed. The laminate layer 310 may be further formed upon the inter carrier ring 304. As such, inter carrier ring 304 becomes a feature internal to the carrier.

Method 500 may continue with forming one or more silos within the one or more laminate layers formed upon the carrier ring (block 508). The pillars 306 may be formed by forming a pillar trench and subsequently forming electrically conductive material within the pillar trench. For example, a pillar trench 362 may be formed by drilling a hole through the laminate layers 310 upon or otherwise above the carrier ring 304 thereby exposing a portion of the carrier ring 304. Electrically conductive material may be formed within the pillar trench 362 by e.g., plating a metal within the trench 362 to form the pillar 306. The pillar 306 may be formed simultaneously with the wiring line via 370.

Method 500 may continue with forming a contact pad upon the perimeter or outer laminate layer and upon the one or more silos (block 510). For example, a contact pad 302 may be formed by forming a mask upon the perimeter surface of laminate $310_6$. The mask may be patterned creating contact trenches at the location(s) where contact pad(s) 302 are desired and that expose the upper surface of pillars 306 and/or via 370. Electrically conductive material, such as a metal, or the like may be formed within the contact trenches, thus forming one or more contact pad(s) 302. The contact pad 302 are formed upon pillars 306 and are thus in electrical contact and/or mechanical contact with each pillar 306. The contact pad 302 may further be formed upon via 370 and are thus in electrical contact and/or mechanical contact with via 370 and the wiring line in which via 370 is further connected. The contact pad 302, the inter carrier ring 304, and the clearance opening 307 may be concentric about the same axis. In an embodiment, the inter carrier ring 304, pillars 306 and contact pad 302 are all formed from the same metal, such as Copper, or the like. Method 500 may end at block 512.

Figure 24:
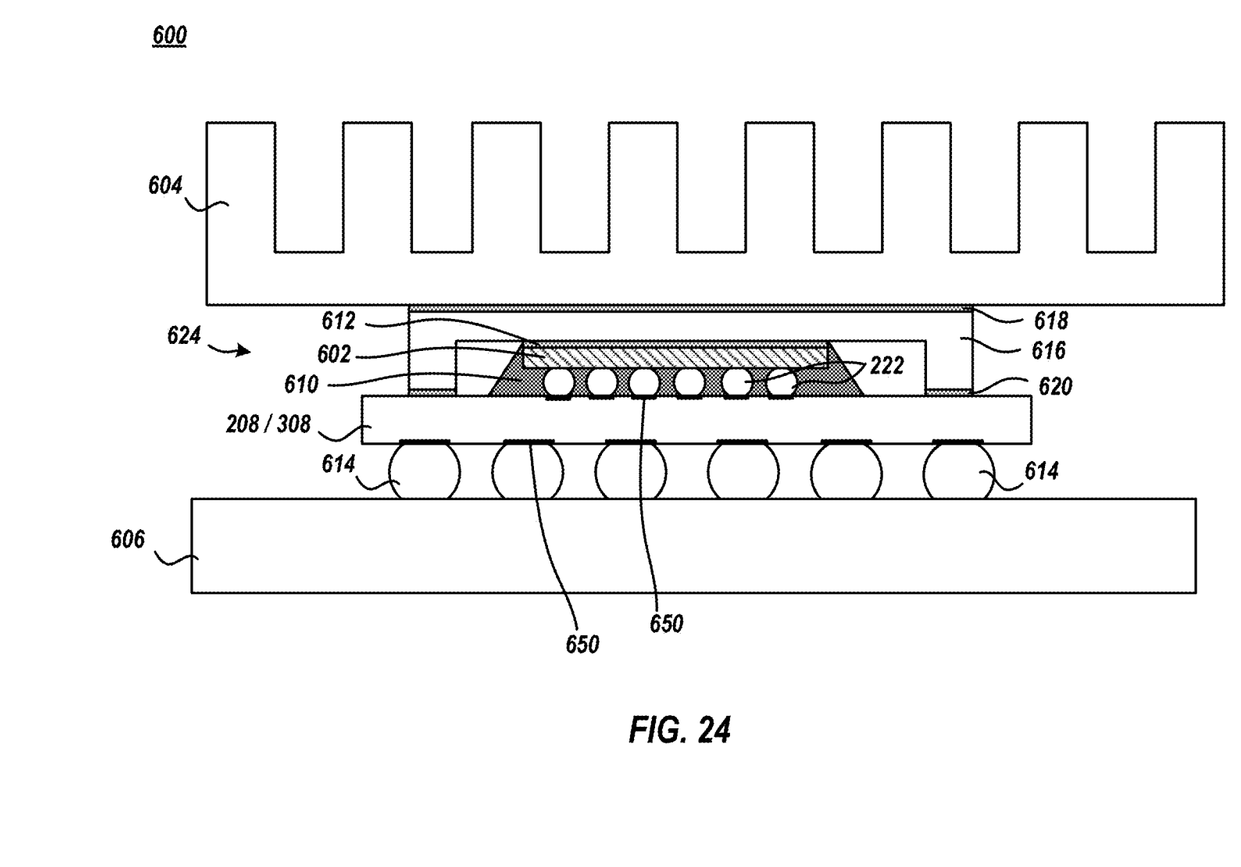
FIG. 24 depicts an electronic system that utilizes one or more embodiments of the present invention.

FIG. 24 depicts an electronic system 600 that utilizes one or more embodiments of the present invention. Electronic device 600 may be for example a computer, server, mobile device, tablet, kiosk, or the like. Package 624 includes chip 602, carrier 208 or carrier 308, solder interconnects 222, underfill 610, thermal interface material 612, lid 616, and adhesive 620. Chip 602 may be an IC chip, die, processor, microchip, field programmable gate array, or the like. Carrier 208 or carrier 308 includes at least one contact 650 and may be an organic carrier and provides mechanical support for chip 602 and electrical paths from the upper surface of the carrier to the opposing side of carrier. Contact 650 is defined to be a contact that includes tapered sidewall contact pad 200 and/or is a contact 300.

Interconnects 222 electrically connect chip 602 and the upper side of carrier 608. Underfill 610 may be electrically-insulating, may substantially surround interconnects 222, may isolate individual interconnects 222, and may provide mechanical support between chip 602 and carrier 208 or carrier 308. Underfill 610 may also prevent damage to individual interconnects 222 due to thermal expansion mismatches between chip 602 and carrier 208 or carrier 308.

When chip 602 is seated upon carrier 208 or carrier 308, a reflow process may be performed to join interconnects 222 to electrical contact pads of both chip 602 and contacts 650 of carrier 208 or carrier 308. After chip 602 is seated to carrier 208 or carrier 308 a lid 616 is attached to carrier 208 or 308 with adhesive 620 to cover chip 602. Generally, during operation of electronic device 600, heat needs to be removed from chip 602. In this situation, lid 616 is both a cover and a conduit for heat transfer. As such, a thermal interface material 612 may thermally join lid 616 and chip 602.

Package 624 may be connected to a motherboard 606 via interconnects 614. Motherboard 606 may be the main printed circuit board of electronic device 600 and includes electronic components, such as a graphics processing unit, memory, and the like, and provides connectors for other peripherals. Interconnects 614 electrically connect the lower side of carrier 208 or carrier 308 to motherboard 606 and may be a wire bond, solder bond, stud, conductive ball, conductive button, and the like. Interconnects 614 may be larger and thus more robust than interconnects 222. When package 624 is seated upon motherboard 606 a second reflow process may be performed to join interconnects 614 to electrical contacts 650 of carrier 208 or carrier 308 and contacts of the motherboard 606. Alternately, a mechanical pressurized interconnect via an intervening socket may be established.

To assist in the removal of heat from chip 602 a heat sink 604 may be thermally joined to package 624 via thermal interface material 618. Heat sink 604 may be a passive or active heat exchanger that cools chip 102 by dissipating heat into the surrounding air or by dissipating heat into an actively cooled fluid. As such, during operation of electronic device 600, a thermal path exists from chip 602 to heat sink 604 through thermal interface material 612, lid 616, and thermal interface material 618, and the like.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or surface of the carrier, regardless of the actual spatial orientation of the carrier. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. An integrated circuit (IC) device carrier comprising: an outer laminate layer upon an internal laminate layer; a contact comprising: a contact pad upon the outer laminate layer, an inner carrier ring upon the internal laminate layer, the inner carrier ring comprising a central opening, and a pillar connected to the contact pad and to the inner carrier ring; and a vertical interconnect access (VIA) connected to and extending from the contact pad through the central opening.

2. The IC device carrier of claim 1, further comprising: one or more interior laminate layers between the outer laminate layer and the internal laminate layer.

3. The IC device carrier of claim 1, wherein the contact pad is electrically conductive.

4. The IC device carrier of claim 1, wherein inner carrier ring is electrically conductive.

5. The IC device carrier of claim 1, wherein the pillar is electrically conductive.

6. The IC device carrier of claim 1, wherein the contact pad comprises an interconnect facing surface that opposes a carrier facing surface, and wherein one or more tapered sidewall(s) connect the carrier facing surface and the interconnect facing surface.

7. The IC device carrier of claim 6, wherein the one or more tapered sidewall(s) are positively tapered relative to the outer layer.

8. The IC device carrier of claim 6, wherein the one or more tapered sidewall(s) are negatively tapered relative to the outer layer.

9. The IC device of claim 1, wherein the contact pad further comprises an interconnect facing surface that opposes a carrier facing surface, wherein a solder interconnect is upon the interconnect facing surface.

10. The IC device of claim 9, wherein the solder interconnect is configured to connect the contact pad of the contact with a contact pad of an IC chip.

11. The IC device of claim 9, wherein the solder interconnect is configured to connect the contact pad of the contact with a contact pad of a motherboard.

12. An IC device carrier fabrication method comprising: forming an inter carrier ring upon an internal layer of the carrier, the inter carrier ring comprising a central opening; forming one or more layers upon the internal layer and upon the inter carrier ring; forming a pillar upon the inter carrier ring within the one or more layers; forming a vertical interconnect access (VIA) within the one or more layers and through the central opening; and forming a contact pad upon the one or more layers and upon and connected to the pillar, and upon and connected to the VIA.

13. The IC device carrier fabrication method of claim 12, wherein the contact pad is electrically conductive.

14. The IC device carrier fabrication method of claim 12, wherein the inter carrier ring is electrically conductive.

15. The IC device carrier fabrication method of claim 12, wherein the contact pad comprises a carrier facing surface directly upon an outer layer of the one or more layers, an interconnect facing surface that opposes the carrier facing surface, and one or more tapered sidewall(s) that connect the carrier facing surface and the interconnect facing surface.

16. The IC device carrier fabrication method of claim 12, wherein the pillar is electrically conductive.

17. The IC device carrier fabrication method of claim 15, wherein the one or more tapered sidewall(s) are positively tapered relative to the outer layer.

18. The IC device carrier fabrication method of claim 15, wherein the one or more tapered sidewall(s) are negatively tapered relative to the outer layer.

19. The IC device carrier fabrication method of claim 15, further comprising: forming a solder interconnect upon the interconnect facing surface.

20. The IC device carrier fabrication method of claim 19, wherein the solder interconnect is configured to connect the contact pad of the contact with a contact pad of an IC chip or is configured to connect the contact pad of the contact with a contact pad of a motherboard.

* * * * *